(12) United States Patent
Jaengbamrung et al.

(10) Patent No.: US 6,560,764 B1
(45) Date of Patent: May 6, 2003

(54) DYNAMIC PULSE WIDTH PROGRAMMING OF PROGRAMMABLE LOGIC DEVICES

(75) Inventors: Wasin Jaengbamrung, Pathumthani (TH); Piyanuch Somchit, Nontaburi (TH); Lersak Nudach, Nonthaburi (TH); Thani Kritphantharak, Nakornsawan (TH); Krissanawas Hiri-o, Nakornsawan (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 152 days.

(21) Appl. No.: 09/624,494

(22) Filed: Jul. 24, 2000

(51) Int. Cl.[7] ............................................. G06F 17/50
(52) U.S. Cl. ........................................... 716/16; 716/17
(58) Field of Search ..................... 716/16, 17; 711/103

(56) References Cited

U.S. PATENT DOCUMENTS 5,869,980 A    2/1999  Chu et al.
5,873,113 A  * 2/1999  Rezvani .................. 365/185.19

OTHER PUBLICATIONS

Zhizheng et al. "A new programming technique for flash memory devices", IEEE VLSI Technology, Systems, and Applications, 1999. International Symposium on , 1999 , pp.: 195–198.*

* cited by examiner

Primary Examiner—Vuthe Siek

(57) ABSTRACT

A novel method is provided for dynamically programming a programmable logic device (PLD). The method involves programming a required test pattern into the PLD using a programming pulse signal having the minimum pulse width. Then, the PLD programming is verified. If the PLD programming is found to be improper, the pulse width of the programming pulse signal is automatically adjusted to a normal pulse width greater than the minimum pulse width. Thereafter, the required test pattern is again programmed into the PLD using the programming pulse signal having the normal pulse width.

7 Claims, 3 Drawing Sheets

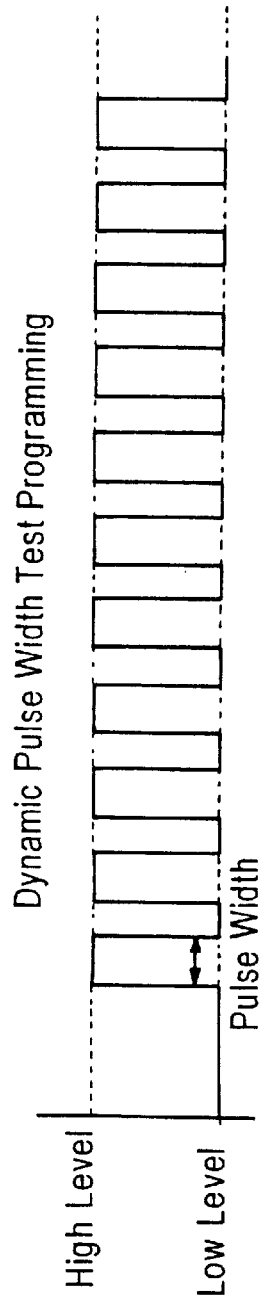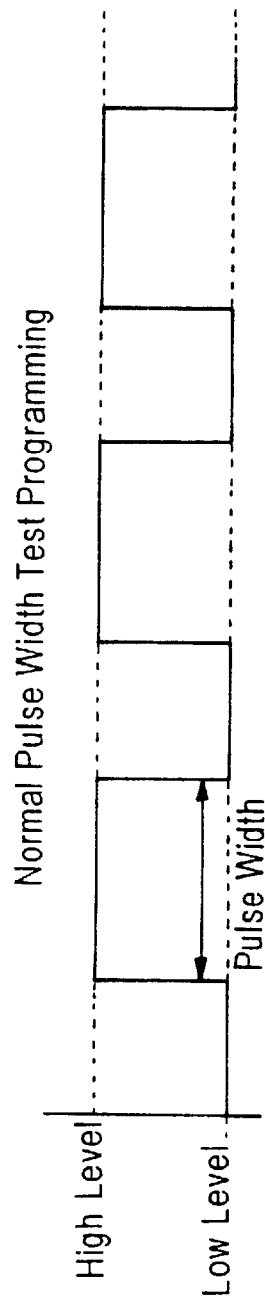

DYNAMIC PULSE WIDTH PROGRAMMING OF PROGRAMMABLE LOGIC DEVICES

FIELD OF THE INVENTION

The present invention relates to programmable logic devices (PLDs), and in particularly, to programming of PLDs using programming pulses having the width dynamically varying during a programming procedure.

BACKGROUND ART

A programmable logic device (PLD) is a digital integrated circuit capable of being programmed to provide a variety of different logic functions. A PLD generally includes AND gates, OR gates, and input/output buffers, and may use on-chip fuses, UV erasable programmable read-only memory (EPROM) arrays, or electrically erasable programmable read-only memory (EEPROM) arrays to programmably create data paths and logic functions that are specific to the user's design. Erasable programmable memory arrays allow the desired functionality of the PLD to be re-programmed many times. This programmability makes a PLD a flexible and powerful tool for a large number of unique applications. For example, in-system programmable logic devices can be field programmed, i.e. programmed in their operating environment without removal from the system where they are deployed.

A complex PLD may include multiple function blocks for performing any one of a variety of logic functions. The logic function performed by a particular logic block is defined by data stored in its associated configuration memory cells. Configuring or programming the PLD is achieved by a programming device that writes configuration data into configuration memory cells.

Verification is required after programming to ensure that the memory cells have been properly programmed and that the PLD is functional to the design specification. Verification of a PLD involves a combination of functional testing, simulation and timing analysis.

Programming of PLDs may be performed using automatic testing equipment or tester so as to achieve advantages of programming, verifying the programming and testing the PLDs on a single piece of equipment and within the operating environment of the PLD. The tester generally includes computerized control circuitry, driver and receiver channels, and connectors for connecting electrical pins of a PLD to be programmed to the driver and receiver channels.

An automatic tester produces a test pattern defining particular functions to be programmed in the PLD. The test pattern specifies programming signals, test signals and expected output signals as a set of test vectors. Test vectors generally provided in digital form indicate a data value, timing and format of each signal during a test cycle. For example, the data value of a signal during a particular test cycle may be specified as either high or low level, the timing of the signal may be defined as a delay relative to the beginning of the test cycle, and the format may indicate that the signal is to be either applied to or observed at a particular pin of the PLD. The tester generally detects defects in programming of a PLD whenever the output signal received from the PLD do not match the expected output signal.

As thousands or even millions of test vectors are required to program a complex PLD, a test pattern programming process may take substantial amount of time. Therefore, it would be desirable to provide a method of test pattern programming that would reduce the time of programming.

SUMMARY OF THE INVENTION

The present invention offers a novel method of dynamically programming a programmable logic device (PLD). The method involves programming a required pattern, such as a test pattern, into the PLD using a programming pulse signal having a first pulse width. Then, the PLD programming is verified. If the PLD programming is found to be improper, the pulse width of the programming pulse signal is automatically adjusted to a second pulse width greater than the first pulse width. Thereafter, the required pattern is again programmed into the PLD using the programming pulse signal having the second pulse width.

The programming of a next pattern into the PLD may be initiated using the programming signal having the first pulse width. If the PLD programming is incorrect, the programming is repeated using the second pulse width.

In a preferred embodiment of the invention, the first pulse width may be the minimum pulse width of the programming signal sufficient to perform programming of the PLD. The minimum value of the pulse width may be determined experimentally.

In accordance with another aspect of the invention, the system for programming a PLD comprises a programming device configured for programming the PLD using a programming signal having a first pulse width, and for automatically adjusting the programming signal to program the PLD using the programming signal having the second pulse width greater than the first pulse width, if the PLD programming performed using the first pulse width is incorrect.

Preferably, the programming device includes a tester for programming a test pattern into the PLD and verifying the PLD programming.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIGS. 3A and 3B respectively illustrate a minimum pulse width programming signal and a normal pulse width programming signal of the present invention.

DESCRIPTION OF THE INVENTION

Figure 1:
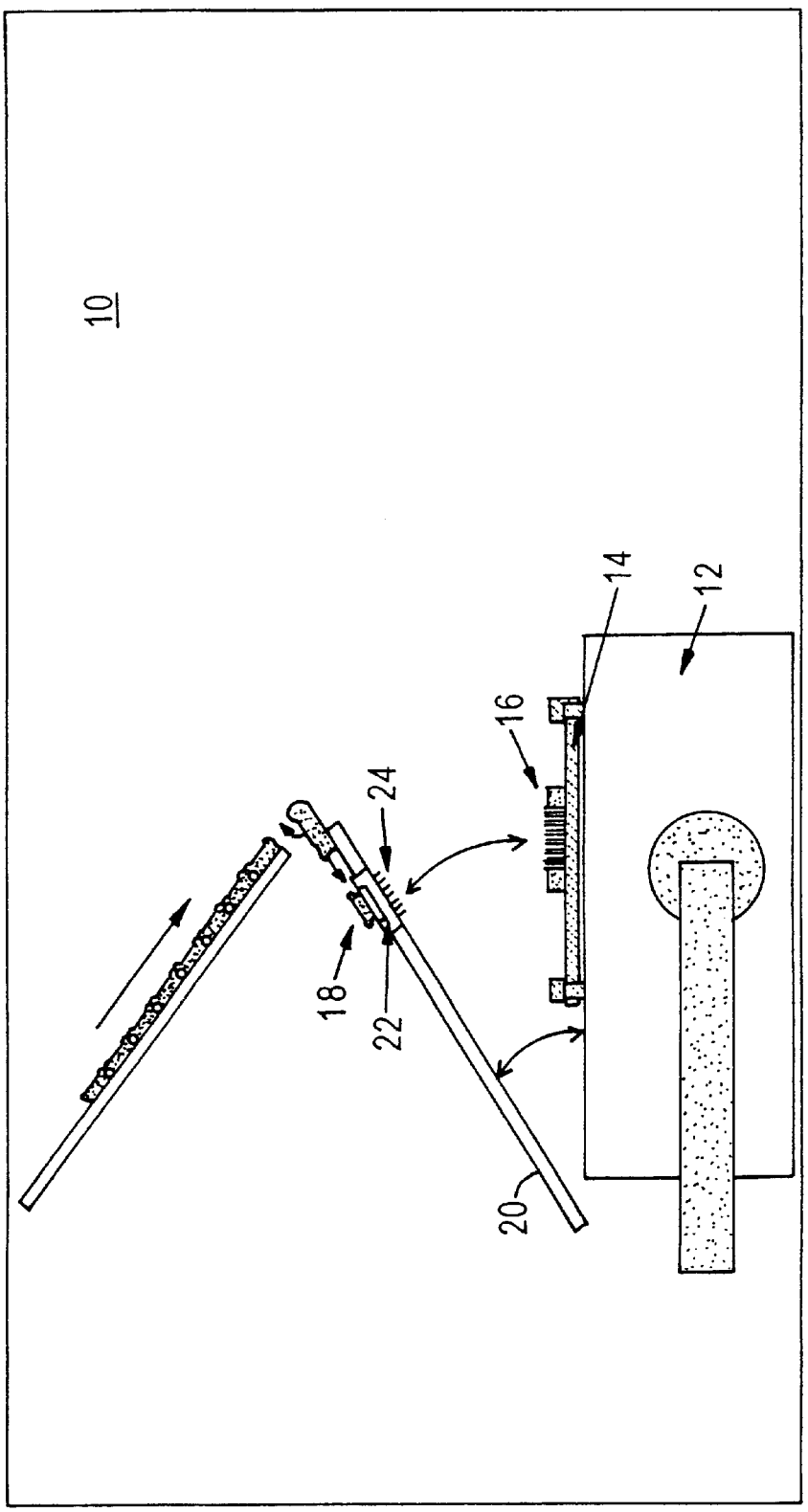
FIG. 1 illustrates an exemplary automatic testing system of the present invention.

FIG. 1 illustrates an exemplary automatic testing system 10 for programming PLDs, verifying the programming and testing the programmed devices. The testing system 10 produces testing patterns to be programmed in PLDs to define particular logic functions, and generates test inputs and expected outputs for verification whether the desired pattern is correctly programmed.

The testing system 10 contains a tester head 12 having a loadboard 14 with a signal pin socket 16 for providing electrical connections with a PLD 18 to be programmed. A handler 20 has a contactor 22 for holding the PLD 18. As shown in FIG. 1, PLDs 18 are placed onto the contactor 22, and the handler 20 is moved down so as to insert signal pins 24 of the contactor 22 into the signal pin socket 16.

A programmable logic device 18 may be any circuitry having programmable memory cells, such as floating gates transistors, for storing configuration information representing desired logic functions. The memory cells may be programmed by switching transistors in either the conducting mode or the non-conducting mode. For example, the memory cells may be a flash memory, EPROM or EEPROM. To program the PLD 18, the tester 10 produces sequences of test patterns representing functions to be programmed. Each test pattern is composed of pulse sequences with specific pulse width produced at specific voltage levels corresponding to high and low levels of the programming signals. The pulse width and voltage levels of the test pattern are controlled by a testing routine preprogrammed in the tester 10.

Conventionally, pulse sequences having fixed pulse width are used for programming of each test pattern into a PLD. This pulse width is made sufficient to guarantee that all PLDs of a certain category are properly programmed. The pulse width of test patterns determines total time required for programming a particular PLD. However, with increase in complexity of PLDs, more test patterns should be programmed in each device. As a result, programming, verification and testing of complex PLDs require substantial time. For example, test time required for test pattern programming with the pulse width of 20 ms may exceed 3 seconds per each PLD.

To reduce the test time, the present invention offers a method of test pattern programming that involves dynamic adjustment of the pulse width of the programming signal during the programming procedure. In particular, test pattern programming of a PLD is initiated using a programming signal having the minimum pulse width sufficient to program a particular PLD. However, if the programmed PLD fails the verification procedure, the tester automatically increases the pulse width of the programming signal to a normal value selected to ensure proper programming of the PLD. The minimum and normal values of the pulse width may be determined experimentally based on testing of a particular PLD.

Figure 2:
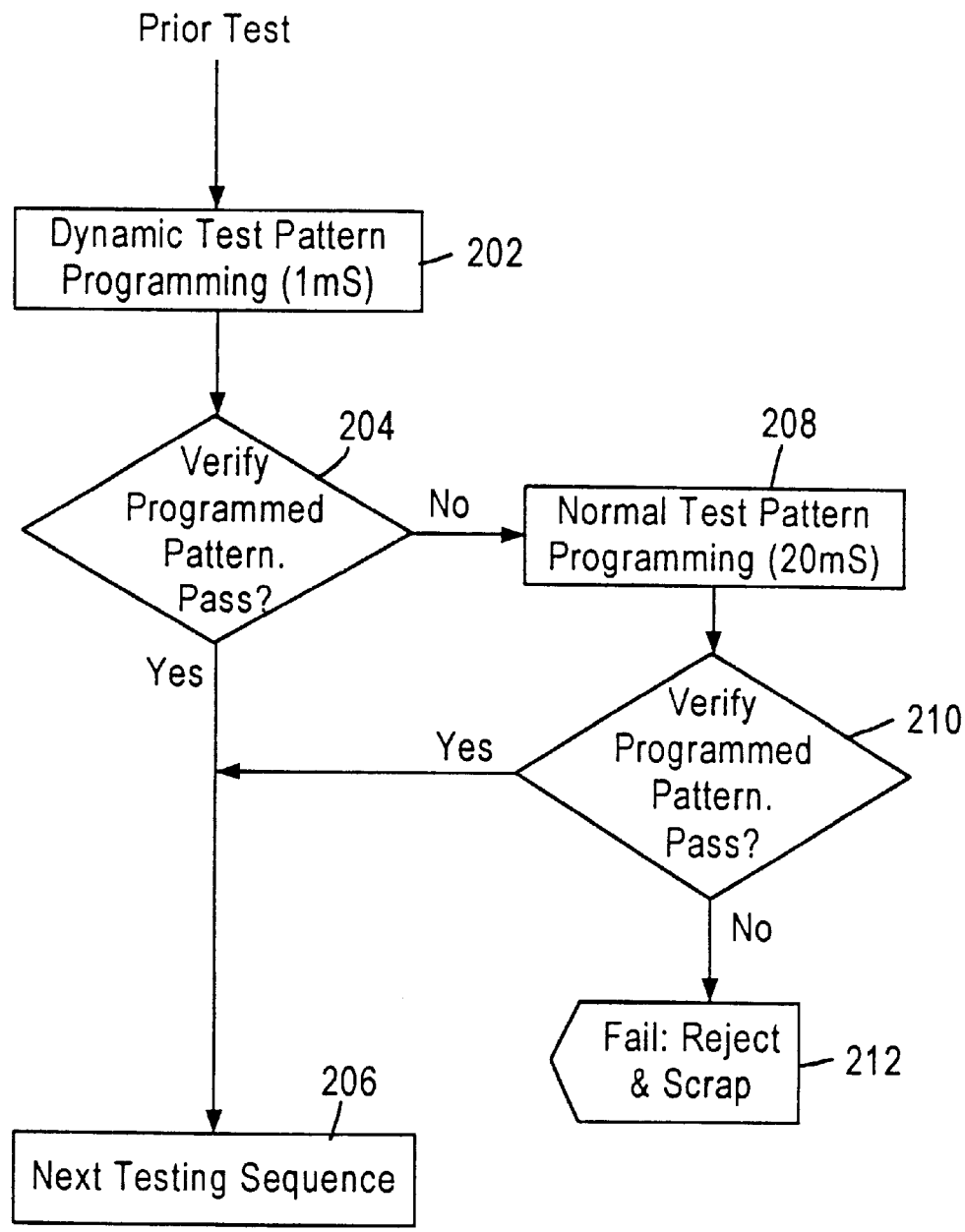
FIG. 2 is a flow chart of a dynamic test pattern programming procedure of the present invention.

FIG. 2 shows a flow chart illustrating dynamic test pattern programming of the present invention. To guarantee quality and performance of a device, a number of tests should be performed before a programmable device is programmed for specific application functions. For memory-based programmable logic devices, tests may include memory cell current reading test, checker board test, address decode test, softwrite test and logic function test. The memory cell current reading test involves measuring the current used for reading out information from memory cells. Information from a memory cell is read out as current, amplified by a sense amplifier and converted into a voltage signal. If the current for reading is too low, the reliability of the device may be unacceptable. The memory cell current test provides accurate data that reflect the actual status of memory cell operation.

The checker board test detects a short circuit between gates of adjacent memory cells by programming the cell array of a PLD into certain check patterns and then verifying them. The logic function test may be done by programming certain complex logic function circuits of a PLD. This programming facilitates functional testing of the device. The preloading of the registers during the logic function test allows direct loading of arbitrary states, making it unnecessary to cycle through long test vector sequences to reach a desired state. The address decoder test checks address decoding. The softwrite test may be performed using low programming voltage for testing a PLD device in a worst case scenario.

After completing preliminary tests, dynamic test pattern programming is performed (step 202) to program a required test pattern into the PLD 18. For example, the test pattern may represent configuration information written into memory cells of the PLD to enable the PLD to perform a desired logical function. In accordance with the present invention, the dynamic test pattern programming is performed using a programming signal having the minimum pulse width sufficient to program a PLD of a particular type. The programming signal is produced by the tester 10. The value of the minimum pulse width is determined experimentally based on testing a predetermined number of PLDs. For example, the minimum pulse width may be set at 1 ms. The pulse sequence used for test pattern programming in step 202 is shown in FIG. 3A. As discussed above, the programming of a PLD may involve writing configuration information in memory cells of the PLD to define a desired logic function of the PLD.

The test pattern programming using the minimum pulse width is followed by verification step 204 carried out by the tester 10 to verify the programming performed in the previous step. In particular, the tester 10 determines whether the required pattern is correctly programmed in the PLD. For example, the verification step may involve generating by the tester 10 a number of simulation test vectors and observing the response to them. The vectors may contain address information and expected data of programmed memory cells in the PLD. Using the address information, the tester 10 accesses the memory cells to compare their data with the expected data.

If the tester 10 determines that the test pattern is programmed correctly, the programming procedure goes to step 206 to carry out next testing operations. For example, the next text pattern may be programmed in the PLD to enable the device to perform another logic function. When all required test patterns are programmed, the tester 10 may test the PLD to determine whether the programmed functions are performed properly.

However, if in step 204, the tester 10 detects errors in the program written into the PLD, the tester 10 concludes that the programming signal with the minimum pulse width fails to program the PLD 18 properly. As a result, the tester 10 automatically increases the pulse width of the programming signal to the normal value. For example, the tester 10 may increase the pulse width from 1 ms to 20 ms. FIG. 3B illustrates a programming signal having the normal value of the pulse width. Then, the tester 10 repeats the programming of the required test pattern into the PLD 18 using the programming signal having the normal value of the pulse width (step 208).

After the programming of the required test pattern is completed, the tester 10 repeats a verification step to determine whether the PLD 18 is programmed properly (step 210). If so, the tester 10 goes to programming the next test pattern to program another logic function of the PLD 18.

The programming of the next test pattern is initiated using the programming signal having the minimum pulse width. If the verification step indicates that the programming is performed incorrectly, the tester 10 automatically adjusts the pulse width of the programming signal to the normal value to repeat programming. This sequence is performed until all required test patterns are programmed into the PLD 18. Then, the tester 10 performs required test operations 206 to test whether the programmed PLD 18 operates properly.

If during the verification step 210 carried out after the programming using the normal pulse width, the tester 10 determines that the PLD 18 remains programmed incorrectly, the tester 10 concludes that the PLD 18 is defective. As a result, the PLD 18 is rejected and scrapped (step 212).

Thus, the present invention provides a novel method of PLD programming involving dynamic changes in the pulse width of the programming signal during the programming procedure. The programming of each test pattern is initiated using the programming signal having the minimum pulse width. However, if the programming verification operation determines that the PLD is programmed improper, the tester automatically adjusts the pulse width of the programming signal to a normal value greater than the minimum pulse width. As a result, time required for the dynamic test pattern programming of the present invention is substantially reduced compared to the time required for programming using the programming signal with the normal pulse width.

In this disclosure, there are shown and described only the preferred embodiment of the invention, but it is to be understood that the invention is capable of changes and modifications within the scope of the inventive concept as expressed herein. For example, the present invention may also be implemented using in-circuit testers that program or re-program PLDs arranged on a circuit board without removing them.

What is claimed is:

1. Method of programming a programmable logic device (PLD), the method comprising the steps of:
   programming a required pattern into the PLD using a programming pulse signal having a first pulse width,
   verifying programming of the PLD,
   automatically increasing pulse width of the programming pulse signal if the PLD programming is improper, and
   programming the required pattern into the PLD using the programming pulse signal having a second pulse width increased with respect to the first pulse width.

2. The method of claim 1, further comprising the step of programming a next pattern into the PLD using the programming signal having the first pulse width.

3. The method of claim 1, wherein the first pulse width is the minimum pulse width of the programming signal sufficient to perform programming of the PLD.

4. The method of claim 3, wherein the minimum pulse width is determined experimentally.

5. The method of claim 1, wherein the required pattern is a test pattern to be programmed into the PLD.

6. A system for programming a PLD, comprising a programming device configured for programming the PLD using a programming signal having a first pulse width, and for automatically adjusting the programming signal to program the PLD using the programming signal having the second pulse width greater than the first pulse width, if the PLD programming performed using the first pulse width is incorrect.

7. The system of claim 6, wherein the programming device includes a tester for programming a test pattern into the PLD and verifying PLD programming.

* * * * *